United States Patent [19]
George

[11] 3,991,411
[45] Nov. 9, 1976

[54] SINGLE DECODER BUBBLE DOMAIN CHIP ORGANIZATION

[75] Inventor: Peter K. George, Placentia, Calif.

[73] Assignee: Rockwell International Corporation, El Segundo, Calif.

[22] Filed: Jan. 20, 1975

[21] Appl. No.: 542,464

[52] U.S. Cl. .......................................... 340/174 TF
[51] Int. Cl.² ........................................ G11C 11/14
[58] Field of Search ............................. 340/174 TF

[56] References Cited
UNITED STATES PATENTS

| | | | |
|---|---|---|---|
| 3,732,551 | 5/1973 | Homma | 340/174 TF |
| 3,825,885 | 7/1974 | Hendel et al. | 340/174 TF |
| 3,858,188 | 12/1974 | Keefe | 340/174 TF |

Primary Examiner—James W. Moffitt
Attorney, Agent, or Firm—H. Fredrick Hamann; G. Donald Weber, Jr.

[57] ABSTRACT

A unique arrangement of magnetic bubble domain devices is utilized to provide an advantageous chip arrangement. One or more storage registers are associated with a controlling path whereby information, for example in the form of magnetic bubbles, is transferred into or out of the storage registers. The controlling path includes replicate/transfer switches for permitting the bubbles to be transferred into or out of the storage register. A generator and an annihilator are provided for producing or destroying magnetic bubble domains. A single decoder is utilized to determine the action to be taken by the controlling path and, thus, the overall operation of the storage register within the chip. A multiple input detector is connected to receive the information from each of the storage registers and to produce a chip output signal. Electrical means are utilized to control the selective operation of the various components of the controlling path.

21 Claims, 1 Drawing Figure

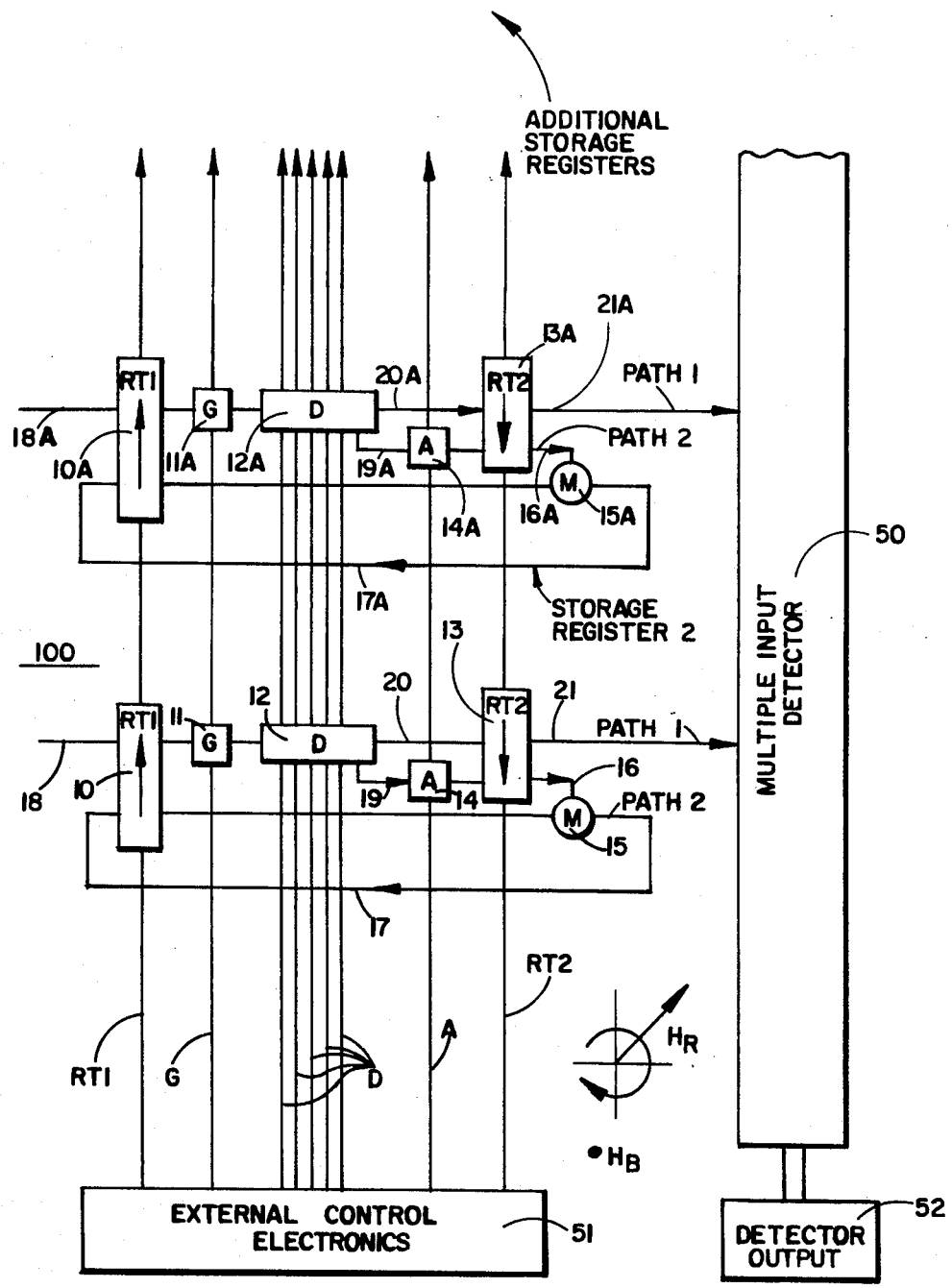

SINGLE DECODER BUBBLE DOMAIN CHIP ORGANIZATION

The invention described herein was made in the course of, or under a contract or subcontract thereunder, with the department of the Army.

BACKGROUND OF THE INVENTION

1. Field of the Invention

This invention relates to a magnetic bubble domain chip and, more particularly, to a unique decoder chip organization and operation thereof.

2. Description of the Prior Art

There is a substantial body of prior art which lists the various components for use in magnetic bubble domain systems. Specific patents or publications are cited in the body of the specification where pertinent. Discovery that materials that support magnetic bubble domains can be controllably produced has provided a new approach to information handling. Various and sundry individual components have been developed to operate on magnetic bubble domains. In addition, several chip concepts have been proposed. In the past, most of these chip designs have been based on the so-called major-minor loop organization. However, the major-minor loop chip organization is generally associated with a rather slow access time. In addition, existing designs require that read data be recycled back into the minor loops which further lengthens and complicates the read process. In the decoder based chip organizations, the disadvantages of long access time and discontinuous data readout can be avoided.

To the extent that decoder based chip organization has been proposed, at least two decoders are required. However, the decoder, per se, usually has a rather narrow margin. The requirement of two or more decoders in proposed chip designs compounds the problem inasmuch as the overall margin requirement becomes more pronounced due to the difficulty in overlapping the margins of the respective components.

SUMMARY OF THE INVENTION

This invention relates to a magnetic bubble domain chip organization using a single decoder. The circuit permits destructive and non-destructive readout from one or more storage registers. A controlling path is associated with each of the storage registers whereby information can be selectively placed in or removed from the storage registers. External control electronics determines the operation of a controlling path to determine whether or not information is placed into or removed from the storage register at a given time. A detector is arranged to detect the information read from any of the storage registers. The controlling path includes a generator and annihilator for selectively generating or annihilating any bubble domains. Replicate/transfer switches control whether the information is transferred from or to a storage register and/or selectively replicated (i.e. detected without removal of information from the storage register). A decoder determines which storage register is affected in terms of reading, writing or annihilating magnetic bubbles therein.

BRIEF DESCRIPTION OF THE DRAWING

The single Figure shows a block diagram of the chip layout contemplated by this invention.

PREFERRED EMBODIMENT

Referring to the single figure, there is shown an illustrative magnetic bubble domain chip organization. This illustrative drawing shows a pair of storage registers identified as storage register 1 and storage register 2. Typically, a large number (N) of storage registers is contemplated in the actual chip realization. Each of the storage registers is identified by a line 17 or 17a. Each of these lines represents a closed loop propagation path which may include a plurality of propagation path elements such as chevrons, T-bars, I-bars or the like. Typically, in the rectangular loop configuration shown in the figure, T-bar propagating devices are preferred. Suitable propagation path corners of devices are known in the art but are not described inasmuch as they are not pertinent to the invention.

The storage register paths 17, 17a and so forth as well as the other components are formed on a suitable material 100 which represents a layer of magnetic bubble domain material. This type material is any suitable material known in the art which will support independent magnetic bubble domains. In addition, suitable means (not shown) are arranged relative to the chip to produce a bias field $H_B$ which is shown as being directed normal to the plane of the layer 100 as well as a rotating field $H_R$ which is shown as rotating in the plane of the layer. The rotation of this field may be clockwise or counter-clockwise depending upon the layout of the system.

External control electronics 51 is any suitable device (or system) which is capable of producing the required conductor control currents. This electronics must be connected to the chip to produce the respective signals on the respective lines emanating therefrom. These signals (and likewise the associated lines) are identified as $RT_1$, G, D (a plurality of lines), A and $RT_2$. In addition, any of the lines which receive signals may be individual or plural conductors depending upon the particular logic required in the construction of the associated component.

Multiple input detector 50 has been described in connection with other organization schemes in technical papers and is familiar to those working in the state of the art. Typically, reference is made to the copending application of J. L. Archer et at., U.S. Ser. No. 290,607, entitled Magnetic Bubble Domain Detection Device and assigned to the common assignee.

A suitable detector output device 52 is connected to detector 50 to produce output signals in accordance with the operation of the detector. In a preferred embodiment, detector 50 may be connected as part of the guardrail which surrounds the system in some chip structure configurations.

The controlling path associated with each storage register comprises a replicate/transfer switch 10 which is connected to receive the $RT_1$ signal from controller 51. Switch 10 is associated with propagation paths 17 and 18 to selectively transfer magnetic bubble domains from path 17 into propagation path 18.

Generator device 11 is of any suitable structure such as a disc or a loop generator. Generator 11 receives the generator signal G from controller 51. Generator 11 is connected in propagation path 18 and supplies bubbles to decoder 12 which directs the bubbles down paths 19 or 20. Generator 11, when not functioning as a generator, per se, is also connected as part of the propagation path between switch 10 and decoder 12 as will become apparent subsequently.

Decoder 12 receives one or more control signals along the lines D. Decoder 12 controls the path of the bubbles, selectively causing the bubbles to move along paths 19 or 20 depending upon the signals applied on lines D. In the illustrative figure, the lines which carry the D signals include five conductors. This number of conductors may be increased or decreased depending upon the number of storage registers in the system. Typically, the number of conductors is representative of the exponent related to a binary configuration which is related to the number of storage registers. For example, if there are 32 storage registers in the system, five lines would be utilized (i.e. $2^5$). If 64 storage registers are utilized, then six lines (i.e. $2^6$) would be utilized.

Decoder 12 is connected to propagation paths 20 and 19. In point of fact, propagation paths 19 and 20 may be considered extensions of propagation path 18 but are identified differently for easy reference. Propagation path 19 is connected to annihilator 14 while propagation path 20 is connected to replicate/transfer switch 13.

Annihilator 14 which may be of any suitable design such as a loop configuration or the like is connected to controller 51 via line A. The output of annihilator 14 (which in reality is usually an extension of propagation path 19) is connected to switch 13.

Switch 13 (which may be of similar design to switch 10) is connected to controller 51 via line $RT_2$. Switch 13 is connected to receive bubbles along propagation path 20 from decoder 12 and to transfer or replicate same into path 21.

Switch 13 produces output signals on paths 16 and 21 which are extensions of propagation paths 20 and 19, respectively. Path 21 is connected to form an input to detector 50. Path 16 is connected to path 17 through a suitable merge or transition device 15. Merge 15, as well as the remainder of the components, is known in the prior art.

In considering the operation of the chip, it is assumed that the initial conditions are such that no useful information is stored in the various registers. In order to store information in the respective storage registers, the fields $H_B$ and $H_R$ are applied and controller 51 is made operative. Signals D supplied by controller 51 will select the decoder 12, 12a or the like. All of the decoders will be serviced by the same signals along the lines D but are arranged to produce different operating characteristics with respect to the signals supplied thereto from controller 51. For example, if signals along lines D are 0001, decoder 12 may be rendered operative to transfer bubbles to propagation path 20 while all other decoders 12a and the like are caused to transfer bubbles to propagation path 19a and the like. A different set of signals on line D would select a different decoder (decoder 12a for example) to propagate bubbles along propagation path 20a while all other decoders would propagate bubbles on lines 19 and the like.

Assuming that the decoder signals are applied and the decoder paths are established, the generator signal G produced by controller 51 is applied to all of the generators 11, 11a and so forth which then produce, in a typical fashion, magnetic bubble domains. These magnetic bubble domains are propagated along the path 18 into decoder 12. In the selected decoder, the bubbles propagated along path 20 are received at switch 13. Switch 13 can then either replicate or transfer the bubble domain signals supplied thereto. In a transfer mode, the bubble domain is switched from propagation path 20 to propagation path 16 and, via merge 15 into storage register 17. In the replicate mode, the same operation occurs with the additional transfer or propagation of the bubble to path 21 and, thus, to detector 50. That is, in each of these operations, bubbles associated with the selected decoder (or register) are transferred into the appropriate register and stored therein. If bubbles are replicated along path 21, the signals are detected by detector 50. This detection operation may be utilized to determine that an appropriate storage has been made. Conversely, if the information provided to detector 50 is undesirable or unnecessary at this time, detector output 52 may be rendered inoperative in any suitable manner.

This operation continues until all of the desired information is stored in propagation path 17 of the storage register. In this condition, switch 10 is effectively inoperative and only functions as a portion of the propagation path. Consequently, the information in propagation loop 17 continues to recirculate under the influence of the rotational field $H_R$.

Under the same circumstances, it should be noted that decoder 12a, for example, has been rendered nonselected wherein bubbles therein are propagated along path 19a. Thus, generator 11a produces bubbles as did generator 11. Decoder 12a operates on these bubbles and diverts them to propagation path 19a rather than path 20a. Bubbles on path 19a are applied to annihilator 14a which is rendered operative along with annihilator 14. Annihilator 14a, however, annihilates or destroys all the bubbles which are applied thereto so that no bubbles continue on to switch 13a.

Thus, it is seen that the same signals supplied by controller 51 are operative to store information in propagation loop 17 of storage register 1 and to effectively clear the same information before it is stored in propagation loop 17a of storage register 2. Of course, as noted supra, a change in the coding of the signals D applied to the decoders will alter this situation wherein the information stored in the propagation loop 17 of storage register 1 will remain unchanged and unaffected while information is stored in propagation loop 17a of the second register. This operation continues until all of the storage registers are loaded with the appropriate information.

Reading information out of the storage registers may be accomplished either nondestructively or destructively. In one mode of nondestructive readout (NDRO), switch 10 is activated by signal $RT_1$ whereby all of the information in the associated storage loop 17 is replicated out of the storage loop. That is, information in storage loop 17 continues to recirculate and is not destroyed but a substantially identical signal is duplicated by switch 10 and produced along propagation path 18. Of course, a generate signal G is not applied to generators 11 or 11a. Rather, these devices function as passive portions of the propagation path whereby information from storage loop 17 is supplied via switch 10 to decoder 12. Decoder 12 then is activated to transfer the information therethrough to path 20 and to switch 13. Switch 13 is, in accordance with the condition of signal $RT_2$, arranged to transfer the bubbles to path 21 (and not to path 16) whereby the information is read out and detected at detector 50. Thus, the information in storage loop 17 continues to recirculate (is not destroyed) but has been replicated and transferred to detector 50 for detection.

Conversely, in the case of the unselected storage registers, detector 12a or the like is controlled so that the information supplied thereto is transferred to propagation path 19a whereby annihilator 14a destroys this information. Consequently, no information is returned to storage loop 17a via path 16a and merge 15a. This latter type of operation in all unselected storage registers so that only the selected storage register and decoder produce signals which are supplied to detector 50. The other storage registers do not supply information to detector 50 but the information stored in the storage loops is neither destroyed nor adversely affected.

In the destructive readout (DRO) mode of operation the information is transferred out of the storage register via switch 10. That is, switch 10, under control of signal $RT_1$ merely transfers the information from storage loop 17 to propagation path 18 without replicating or returning any information to storage loop 17. The operation of the other components is substantially the same as noted supra. That is, information transferred from loop 17 via switch 10 is propagated through devices 11, 12, 13 and 21 to detector 50 in the selected register or through devices 11, 12 and 14 in the unselected registers. Thus, destructive readout can be used to effectively clear a storage register for insertion of additional information subsequently.

Thus, there has been shown and described a preferred embodiment of a magnetic bubble domain system organization. In this organization, information in read into a storage register in serial fashion and is read out in the same serial fashion with a first-in, first-out operation. One significant advantage of this chip organization is the reduction in number of control conductors required to control the chip ($2^N$) compared to individually wiring each storage loop.

As stated above, various components, elements and devices are known in the art. Obviously, as the art progresses new and improved components, elements and devices will be utilized. However, this chip layout is not dependent, per se, on the specific components, elements or devices. For example, whether the propagation paths are chevrons, T-bars, I-bars or the like is substantially immaterial although fabrication techniques will prefer one or the other type of device. Consequently, any interchangeable device or components or elements may be utilized in this scheme without departing from the inventive concept. This description is intended to be illustrative only and not to be limitative. Any system which utilizes this basic concept and falls within the purview of the description is intended to be covered or included therein. The scope of this invention is intended to be limited only by the claim appended hereto.

Having thus described a preferred embodiment of the invention, what is claimed is:

1. In combination:
   storage register means for storing information signals therein,
   generator means for selectively producing information signals,
   decoder means coupled to said generator means for receiving information signals therefrom,
   switch means coupled to said storage register means for selectively transferring information signals between said storage register means and least one of said generator means and said decoder means,
   said switch means comprising first and second switches,
   said first switch adapted to transfer information signals from said storage register means to said generator means, and
   said second switch adapted to transfer information signals from said decoder means to said storage means.

2. The combination recited in claim 1 wherein said storage register means comprises a continuous recirculation loop.

3. The combination recited in claim 1 wherein said switch means comprises at least one transfer/replicate switch.

4. The combination recited in claim 1 wherein
   said decoder means has an input connected to said generator means, a first output connected to said second switch, and a second output connected to said second switch via annihilator means.

5. The combination recited in claim 1 wherein
   each of said first and second switches are transfer/replicate switches.

6. The combination recited in claim 1 including annihilator means coupled between said decoder means and said second switch.

7. The combination recited in claim 6 including merging means coupled between said switch means and said storage register means.

8. The combination recited in claim 7 including detector means coupled to said switch means.

9. The combination recited in claim 1 including a layer of selectively magnetizable material for supporting the components recited in claim 1, wherein said information signals comprise isolated regions of magnetization.

10. The combination recited in claim 9 including
    magnetic field source means for supplying magnetic fields thereto; and
    said information signals comprise magnetic bubble domains.

11. The combination recited in claim 1 including control means for supplying control signals to certain of the recited components in order to selectively activate same.

12. The combination recited in claim 11 wherein
    said decoder means selectively directs information signals to said switch means or to said storage register means in response to control signals from said control means.

13. The combination recited in claim 12 wherein
    said control means supplies control signals to said decoder means for controlling the operation of said decoder means,
    said decoder means is operative to supply information signals from said generator means to said second switch in response to a first condition of said control signals,
    said decoder means is operative to supply information signals to said storage register means in response to a second condition of said control signals, and
    annihilator means connected between said decoder means and said storage register means to selectively provide a passive propagation path or an annihilation means in response to control signals from said control means.

14. The combination recited in claim 1 wherein said storage register means comprises a propagation path for moving magnetic bubble domains therealong.

15. The combination recited in claim 14 wherein
said storage register means comprises a continuous loop propagation path, and
at least a portion of said first switch forms a portion of said continuous loop whereby said first switch can selectively transfer information along said propagation path or out of said propagation path to said decoder means via said generator means in response to a switch control signal.

16. The combination recited in claim 1 wherein
said switch means comprises at least one replicate/transfer switch for selectively transferring and replicating information signals whereby destructive and non-destructive readout operation is selectively achieved.

17. The combination recited in claim 16 wherein
said first switch comprises said replicate/transfer switch.

18. In combination,
storage register means for storing information signals therein,
generator means for selectively producing information signals,
decoder means coupled to said generator means for receiving information signals therefrom;
switch means coupled to said storage register means for selectively transferring information signals between said storage register means and said generator means and said decoder means,
said switch means comprises first and second switches,
said first switch adapted to transfer information signals from said storage register means to said generator means,
said second switch adapted to transfer information signals from said decoder means to said storage register means,
annihilator means coupled between decoder means and said second switch,
merging means coupled between said second switch and said storage register means,
detector means coupled to said second switch, and
control means for supplying control signals to the recited components in order to selectively activate same.

19. The combination recited in claim 18 wherein
said generator means selectively produces information signals in the form of magnetic bubble domains in response to a generator control signal from said control means and functions as a passive propagation path element in the absence of said generator control signal,
said decoder means receives signals from said generator means regardless of the functional status of said generator means and determines the disposition of said information signals in response to decode control signals from said control means,
said second switch connected to receive information signals from said decoder means in a first disposition of said information signals in response to first decode control signals,
said annihilator means connected to receive information signals from said decoder means in a second disposition of said information signals in response to second decode control signals,
said annihilator means operative to annihilate said information signals supplied thereto in response to an annihilate control signal and to supply said information signals to said second switch in the absence of said annihilate control signal,
said second switch operative to supply said information signals from said annihilator means to said storage register means via said merging means in response to second decode control signals and the absence of said annihilate control signal whereby information signals produced by said generator means are stored in said storage register means,
said second switch further operative to supply said information signals from said decoder means to said detector means in response to a first switch control signal and to said detector means and said storage means via said merging means concurrently in response to a second switch control signal, and
said first switch means supplies information signals from said storage register means to said decoder means via said generator means in response to a third switch control signal and to said storage means and said generator means concurrently in response to a fourth switch control signal.

20. The combination recited in claim 18 wherein said generator means, said decoder means, said first switch and said second switch are coupled together by a common propagation path for transferring magnetic bubble domains.

21. The combination recited in claim 20 wherein said annihilator means is coupled to said decoder means by a separate propagation path for transferring magnetic bubble domains.

* * * * *